United States Patent
Ando et al.

(10) Patent No.: US 11,655,415 B2
(45) Date of Patent: May 23, 2023

(54) NANOPHOSPHOR-ATTACHED INORGANIC PARTICLES AND WAVELENGTH CONVERSION MEMBER

(71) Applicant: NIPPON ELECTRIC GLASS CO., LTD., Otsu (JP)

(72) Inventors: Tamio Ando, Otsu (JP); Tadahito Furuyama, Otsu (JP); Shunsuke Fujita, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 94 days.

(21) Appl. No.: 16/605,510

(22) PCT Filed: Jun. 4, 2018

(86) PCT No.: PCT/JP2018/021393
§ 371 (c)(1),
(2) Date: Oct. 16, 2019

(87) PCT Pub. No.: WO2018/235580
PCT Pub. Date: Dec. 27, 2018

(65) Prior Publication Data
US 2020/0123439 A1  Apr. 23, 2020

(30) Foreign Application Priority Data

Jun. 19, 2017  (JP) .............................. JP2017-119486

(51) Int. Cl.
*C09K 11/02* (2006.01)
*C09K 11/62* (2006.01)
(Continued)

(52) U.S. Cl.
CPC .............. *C09K 11/025* (2013.01); *C01F 5/02* (2013.01); *C01F 7/02* (2013.01); *C01G 9/02* (2013.01);
(Continued)

(58) Field of Classification Search
CPC ....... C09K 11/025; C09K 11/62; C09K 11/64; C09K 11/70
See application file for complete search history.

(56) References Cited

U.S. PATENT DOCUMENTS

| 2013/0011551 A1 | 1/2013 | Zhou et al. |
| 2013/0334557 A1 | 12/2013 | Uchida et al. |

(Continued)

FOREIGN PATENT DOCUMENTS

| CN | 106414661 A | 2/2017 |
| CN | 106414663 A | 2/2017 |

(Continued)

OTHER PUBLICATIONS

Official Communication issued in International Patent Application No. PCT/JP2018/021393, dated Sep. 4, 2018.
Official Communication issued in corresponding Chinese Patent Application No. 201880040312.1, dated Dec. 30, 2021.

*Primary Examiner* — Matthew E. Hoban
(74) *Attorney, Agent, or Firm* — Keating and Bennett, LLP

(57) ABSTRACT

Provided are nanophosphor-attached inorganic particles that can suppress the degradation of the nanophosphor when sealed in glass, and a wavelength conversion member using the nanophosphor-attached inorganic particles. The nanophosphor-attached inorganic particle 10 include: inorganic particles 1 having an average particle diameter of 1 μm or more; and a nanophosphor 2 attached to surfaces of the inorganic particles 1.

14 Claims, 2 Drawing Sheets

(51) Int. Cl.
*C09K 11/64* (2006.01)
*C01F 5/02* (2006.01)
*C01F 7/02* (2022.01)
*C01G 9/02* (2006.01)
*C03C 3/16* (2006.01)
*C03C 3/247* (2006.01)
*C03C 14/00* (2006.01)
*C09K 11/70* (2006.01)
*C09K 11/74* (2006.01)
*C09K 11/75* (2006.01)
*C09K 11/88* (2006.01)
*H01L 33/50* (2010.01)
*B82Y 20/00* (2011.01)

(52) U.S. Cl.
CPC ............... *C03C 3/16* (2013.01); *C03C 3/247* (2013.01); *C03C 14/004* (2013.01); *C09K 11/62* (2013.01); *C09K 11/64* (2013.01); *C09K 11/70* (2013.01); *C09K 11/7492* (2013.01); *C09K 11/75* (2013.01); *C09K 11/883* (2013.01); *H01L 33/504* (2013.01); *B82Y 20/00* (2013.01); *C01P 2004/10* (2013.01); *C01P 2004/32* (2013.01); *C01P 2004/61* (2013.01)

(56) References Cited

U.S. PATENT DOCUMENTS

| | | |
|---|---|---|
| 2014/0003074 A1 | 1/2014 | Kishimoto |
| 2017/0190965 A1* | 7/2017 | Budd ..................... C09K 11/02 |
| 2017/0217830 A1* | 8/2017 | Kadomi ..................... C03C 8/16 |
| 2017/0358745 A1* | 12/2017 | Juang ..................... H01L 33/145 |

FOREIGN PATENT DOCUMENTS

| | | | |
|---|---|---|---|
| CN | 106458721 A | | 2/2017 |
| JP | 2012-087162 A | | 5/2012 |
| JP | 2012087162 | * | 5/2012 |
| JP | 2013-525243 A | | 6/2013 |
| JP | 2016-012711 A | | 1/2016 |
| JP | 2016-023098 A | | 2/2016 |
| JP | 2016-050265 A | | 4/2016 |
| JP | 2016050265 | * | 4/2016 |
| JP | 2016-138176 A | | 8/2016 |
| TW | 201547067 A | | 12/2015 |
| WO | 2012/102107 A1 | | 8/2012 |
| WO | 2012/124587 A1 | | 9/2012 |
| WO | 2012/161065 A1 | | 11/2012 |
| WO | 2015/187490 A1 | | 12/2015 |
| WO | 2018/092644 A1 | | 5/2018 |

* cited by examiner

[FIG. 1]
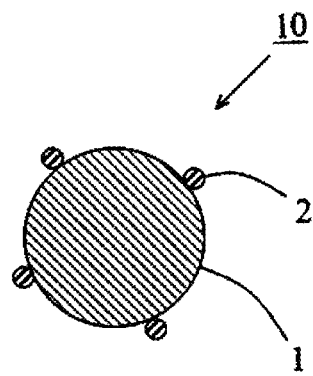
[FIG. 2]
(a)
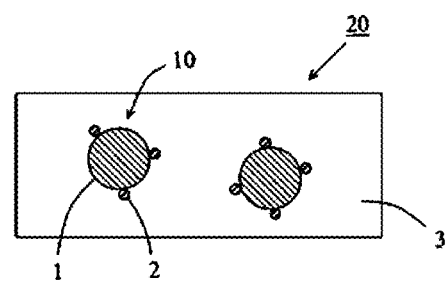
(b)
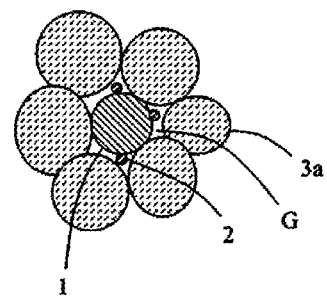

[FIG. 3]
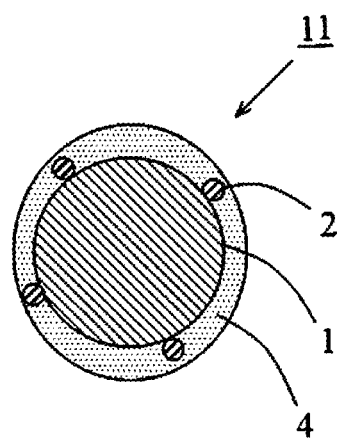

NANOPHOSPHOR-ATTACHED INORGANIC PARTICLES AND WAVELENGTH CONVERSION MEMBER

TECHNICAL FIELD

The present invention relates to nanophosphor-attached inorganic particles and wavelength conversion members using the same.

BACKGROUND ART

Recently, studies have been made on light emitting devices in which an excitation light source, such as a light emitting diode (LED) or a semiconductor laser diode (LD), is used and fluorescence generated by applying excitation light generated from the excitation light source to a phosphor is used as illuminating light. Furthermore, studies have also been made on the use of a nanophosphor, such as quantum dots, as a phosphor. Quantum dots can be controlled in fluorescence wavelength by changing their diameter and have high luminous efficiency (see, for example, Patent Literatures 1 to 3).

Nanophosphors have the property of easily degrading by contact with moisture or oxygen in the atmosphere. Therefore, nanophosphors are used in a sealing state sealed by resin or the like to avoid contact with the external environment. However, if resin is used as a sealing material, there arises a problem that the resin is discolored by heat generated from the nanophosphor by irradiation with excitation light. In addition, resin is poor in water resistance and permeable to water, which presents a problem that the nanophosphor is likely to degrade with time. To cope with these problems, studies have been made on the use, as a sealing material for nanophosphor, of glass excellent in thermal resistance and water resistance (see, for example, Patent Literature 4).

CITATION LIST

Patent Literature

PTL 1

WO 2012/102107

PTL 2

WO 2012/161065

PTL 3

JP-A-2013-525243

PTL 4

JP-A-2012-87162

SUMMARY OF INVENTION

Technical Problem

When glass is used as a sealing material for nanophosphor, the wavelength conversion member itself has excellent thermal resistance and water resistance, but there arises a problem that the nanophosphor itself may degrade by reaction with the glass. As a result, a wavelength conversion member having a desired luminous efficiency may be less likely to be obtained.

In view of the foregoing, the present invention has an object of providing nanophosphor-attached inorganic particles that can suppress the degradation of nanophosphor when sealed in glass, and providing a wavelength conversion member using the nanophosphor-attached inorganic particles.

Solution to Problem

Nanophosphor-attached inorganic particles according to the present invention comprising: inorganic particles having an average particle diameter of 1 µm or more; and a nanophosphor attached to surfaces of the inorganic particles. By doing so, when the nanophosphor-attached inorganic particles are sealed in glass, the degradation of the nanophosphor can be suppressed. The reason for this can be presumed as follows. When the nanophosphor-attached inorganic particles according to the present invention are sealed in glass, minute gaps are formed between the inorganic particles and the glass matrix and the nanophosphor is located in the gaps, so that the contact of the nanophosphor with the glass matrix is reduced. As a result, the degradation of the nanophosphor due to reaction with the glass can be suppressed and, thus, the luminous efficiency of the wavelength conversion member can be easily improved.

In the nanophosphor-attached inorganic particles according to the present invention, use can be made, as the inorganic particles, of inorganic particles made of at least one material selected from the group consisting of $SiO_2$, $Al_2O_3$, $ZrO_2$, $TiO_2$, MgO, ZnO, and CeO.

In the nanophosphor-attached inorganic particles according to the present invention, the inorganic particles have, for example, a spherical shape, a crushed shape, an acicular shape, a flaky shape or a hollow bead-like shape.

In the nanophosphor-attached inorganic particles according to the present invention, the inorganic particles may have pores and the nanophosphor may be attached to inner surfaces of the pores. By doing so, the contact of the nanophosphor with the glass matrix can be further reduced.

In the nanophosphor-attached inorganic particles according to the present invention, the inorganic particles may be secondary particles.

In the nanophosphor-attached inorganic particles according to the present invention, the inorganic particles have an average particle diameter of, for example, 1 to 100 nm.

In the nanophosphor-attached inorganic particles according to the present invention, use can be made, as the nanophosphor, a quantum dot phosphor made of at least one material selected from the group consisting of CdS, CdSe, CdTe, ZnS, ZnSe, ZnTe, InP, GaN, GaAs, GaP, AlN, AlP, AlSb, InN, InAs, and InSb or a composite of two or more materials selected from the group.

The nanophosphor-attached inorganic particles according to the present invention preferably have coating layers on surfaces thereof. By doing so, the contact of the nanophosphor with the glass matrix can be further reduced.

A wavelength conversion member according to the present invention is formed with the above-described nanophosphor-attached inorganic particles dispersed in a glass matrix.

In the wavelength conversion member according to the present invention, the glass matrix preferably has a deformation temperature of 380° C. or below. By doing so, thermal degradation of the nanophosphor during production can be suppressed.

The wavelength conversion member according to the present invention is preferably formed of a sintered body of the nanophosphor-attached inorganic particles and a glass powder. By doing so, a wavelength conversion member can be easily produced in which the nanophosphor-attached inorganic particles are homogeneously dispersed in the glass matrix.

In the wavelength conversion member according to the present invention, the glass matrix is preferably made of a $SnO-P_2O_5$-based glass or a $SnO-P_2O_5$-based glass.

A method for producing nanophosphor-attached inorganic particles according to the present invention is a method for producing the above-described nanophosphor-attached inorganic particles and includes the steps of: mixing a liquid comprising a nanophosphor dispersed in a dispersion medium with inorganic particles; and removing the dispersion medium in the liquid.

A method for producing a wavelength conversion member according to the present invention includes mixing the nanophosphor-attached inorganic particles produced by the above-described method with a glass powder and then firing the nanophosphor-attached inorganic particles and the glass powder mixed together.

In the method for producing a wavelength conversion member according to the present invention, the glass powder preferably has an average particle diameter of 0.1 to 100 μm.

Advantageous Effects of Invention

The present invention enables provision of nanophosphor-attached inorganic particles that can suppress the degradation of nanophosphor when sealed in glass, and provision of a wavelength conversion member using the nanophosphor-attached inorganic particles.

BRIEF DESCRIPTION OF DRAWINGS

FIG. 1 is a schematic cross-sectional view of a nanophosphor-attached inorganic particle according to an embodiment of the present invention.

FIG. 2(a) is a schematic cross-sectional view of a wavelength conversion member according to an embodiment of the present invention and FIG. 2(b) is an enlarged view of a nanophosphor-attached inorganic particle and its surroundings in the wavelength conversion member.

FIG. 3 is a schematic cross-sectional view of a nanophosphor-attached inorganic particle according to another embodiment of the present invention.

DESCRIPTION OF EMBODIMENTS

Hereinafter, a description will be given of preferred embodiments. However, the following embodiments are merely illustrative and the present invention is not limited to the following embodiments. Throughout the drawings, members having substantially the same functions may be referred to by the same reference characters.

FIG. 1 is a schematic cross-sectional view of a nanophosphor-attached inorganic particle according to an embodiment of the present invention. A nanophosphor-attached inorganic particle 10 according to this embodiment includes an inorganic particle 1 and a nanophosphor 2 attached to the surface of the inorganic particle 1.

FIG. 2(a) is a schematic cross-sectional view of a wavelength conversion member according to an embodiment of the present invention and FIG. 2(b) is an enlarged view of a nanophosphor-attached inorganic particle and its surroundings in the wavelength conversion member. A wavelength conversion member 20 according to this embodiment has a structure in which the nanophosphor-attached inorganic particles 10 described above are dispersed in a glass matrix 3. In this embodiment, the glass matrix 3 is formed of a sintered body of a glass powder 3a.

As shown in FIG. 2(b), the nanophosphor-attached inorganic particle 10 is surrounded and sealed by the sintered body of glass powder 3a. Thus, minute gaps G are formed between the inorganic particles 1 and the glass powder 3a and the nanophosphor 2 is located in the gaps G, so that the contact of the nanophosphor 2 with the glass powder 3a is reduced. As a result, the degradation of the nanophosphor 2 due to reaction with the glass powder 3a can be suppressed and, thus, the luminous efficiency of the wavelength conversion member 20 can be easily improved.

All the particles of the nanophosphor 2 attached to each inorganic particle 1 need not necessarily be out of contact with the glass matrix 3 (glass powder 3a). In other words, it is possible that some particles of the nanophosphor 2 are out of contact with the glass matrix 3 and the other particles of the nanophosphor 2 are in contact with the glass matrix 3.

FIG. 3 is a schematic cross-sectional view of a nanophosphor-attached inorganic particle according to another embodiment of the present invention. A nanophosphor-attached inorganic particle 11 according to this embodiment is different from the nanophosphor-attached inorganic particle 10 described in FIG. 1 in that the particle 11 has a coating layer 4 on its surface. Specifically, the coating layer 4 is formed to cover the inorganic particle 1 and the nanophosphor 2. By doing so, the contact of the nanophosphor 2 with the glass matrix 3 can be further reduced. However, the coating layer 4 need not necessarily cover the whole of the inorganic particle 1 and the nanophosphor 2 and may partially cover the inorganic particle 1 and/or the nanophosphor 2. An example of the coating layer 4 is a layer made of $SiO_2$.

Each of the constituent features of the invention will be described below in detail.

Examples of the inorganic particle 1 include ceramic particles of oxides, including $SiO_2$, $Al_2O_3$, $ZrO_2$, $TiO_2$, MgO, ZnO, and CeO. Other examples that can be used include nitrides, such as AlN and BN, fluorides, such as $AlF_3$ and $CaF_2$, and $BaSO_4$. These types of inorganic particles 1 can be used alone or in a mixture of two or more thereof. The inorganic particle 1 may be an aggregate formed of a plurality of particles, i.e., a secondary particle. When the inorganic particle 1 is a secondary particle, pores can be easily formed inside. In this case, by attaching the nanophosphor 2 to the inner surfaces of the pores as will be described hereinafter, the contact of the nanophosphor 2 with the glass matrix 3 can be further reduced.

The average particle diameter of the inorganic particles 1 is preferably 1 μm or more, more preferably 1.1 μm or more, even more preferably 2 μm or more, still more preferably 5 μm or more, yet still more preferably 10 μm or more, and particularly preferably 30 μm or more. If the average particle diameter of the inorganic particles 1 is too small, the effect of reducing the contact of the nanophosphor 2 with the glass matrix 3 is less likely to be achieved. On the other hand, if the average particle diameter of the inorganic particles 1 is too large, the porosity of the wavelength conversion member 20 becomes large and light scattering thereof thus becomes large, so that the luminous efficiency is likely to decrease. In addition, the mechanical strength of the wavelength conversion member 20 is likely to decrease. Therefore, the average particle diameter of the inorganic particles 1 is preferably not more than 200 µm, more preferably not more than 150 µm, even more preferably not more than 120 µm, still more preferably not more than 100 µm, yet still more preferably not more than 80 µm, and particularly preferably not more than 70 µm. As used herein, the average particle diameter refers to a value ($D_{50}$) measured in conformity with JIS-R1629. Furthermore, when the inorganic particles 1 are secondary particles, the diameters of the secondary particles are preferably in the above range.

No particular limitation is placed on the shape of the inorganic particles 1 and examples include spherical, crushed, acicular, flaky, and hollow bead-like shapes. It is possible that the inorganic particles 1 have pores (or are porous) and the nanophosphor 2 is attached to the inner surfaces of the pores. By doing so, the contact of the nanophosphor 2 with the glass matrix 3 can be further reduced.

The content of the inorganic particles 1 in the wavelength conversion member 20 is, in terms of % by mass, preferably 1 to 50%, more preferably 3 to 30%, and particularly preferably 5 to 20%. If the content of the inorganic particles 1 is too small, the effect of reducing the contact of the nanophosphor 2 with the glass matrix 3 is less likely to be achieved. On the other hand, if the content of the inorganic particles 1 is too large, the porosity of the wavelength conversion member 20 becomes large and light scattering thereof thus becomes large, so that the luminous efficiency is likely to decrease. In addition, the mechanical strength of the wavelength conversion member 20 is likely to decrease.

Examples of the nanophosphor 2 include quantum dot phosphors of CdS, CdSe, CdTe, ZnS, ZnSe, ZnTe, InP, GaN, GaAs, GaP, AlN, AlP, AlSb, InN, InAs, InSb, and so on. These types of quantum dot phosphors can be used alone or in a mixture of two or more thereof. Alternatively, a composite formed of two or more of these materials (for example, a core-shell structure in which the surface of a CdSe particle is coated with ZnS) may be used as a quantum dot phosphor. Still alternatively, examples of the nanophosphor that can be used include, other than the quantum dot phosphors, inorganic particles of oxides, nitrides, oxynitrides, sulfides, oxysulfides, rare earth sulfides, aluminate chlorides, halophosphate chlorides, and so on. These types of inorganic particles can be used alone or in a mixture of two or more thereof. No particular limitation is placed on the average particle diameter of the nanophosphor, but it is preferably 1 to 100 nm, more preferably 1 to 50 nm, even more preferably 1 to 30 nm, still more preferably 1 to 15 nm, and yet still more preferably about 1.5 to 12 nm.

The content of the nanophosphor 2 in the nanophosphor-attached inorganic particles 10 is, in terms of % by mass, preferably 0.02% or more, more preferably 0.05% or more, still more preferably 0.1% or more, yet still more preferably 0.3% or more, and particularly preferably 0.5% or more. If the content of the nanophosphor 2 in the nanophosphor-attached inorganic particles 10 is too small, a sufficient luminescence intensity is less likely to be achieved. On the other hand, no particular limitation is placed on the upper limit of the content of the nanophosphor 2 in the nanophosphor-attached inorganic particles 10, but it is, on a realistic level, preferably 50% or less and particularly 40% or less.

The luminous efficiency of the wavelength conversion member 20 varies depending upon the type and content of nanophosphor 2 dispersed in the glass matrix 3 and the thickness of the wavelength conversion member 20. If there is a desire to increase the luminous efficiency, the luminous efficiency can be controlled by reducing the thickness of the wavelength conversion member 20 to increase the fluorescence or excitation light transmittance or by increasing the content of nanophosphor 2 to increase the amount of fluorescence. However, if the content of the nanophosphor 2 is too large, sintering is less likely to progress during production and the porosity increases, which tends to present problems, such as difficulty in efficiently irradiating the nanophosphor 2 with excitation light and ease of reduction in the mechanical strength of the wavelength conversion member 20. On the other hand, if the content of the nanophosphor 2 is too small, a sufficient luminescence intensity is less likely to be achieved. Therefore, the content of the nanophosphor 2 in the wavelength conversion member 20 is preferably appropriately controlled in a range of, preferably 0.01 to 30% by mass, more preferably 0.05 to 10% by mass, and particularly preferably 0.08 to 5% by mass.

The deformation temperature of the glass matrix 3 is preferably 380° C. or below, more preferably 300° C. or below, and particularly preferably 200° C. or below. If the deformation temperature of the glass matrix 3 is too high, the sintering temperature during production of the wavelength conversion member 20 accordingly becomes high, so that the nanophosphor 2 is likely to degrade. On the other hand, no particular limitation is placed on the lower limit of the deformation temperature of the glass matrix 3, but it is, on a realistic level, preferably 100° C. or above and particularly preferably 120° C. or above. The term deformation temperature used herein refers to a point where a specimen measured with a thermal expansion coefficient measurement (TMA) device exhibited a maximum elongation, i.e., a value at which the elongation of the specimen was arrested.

The preferred glasses for the glass matrix 3 are Sn— and P-based glasses having low deformation temperatures, such as $SnO$—$P_2O_5$-based glasses, $SnO$—$P_2O_5$—$B_2O_3$-based glasses, and $SnO$—$P_2O_5$—F-based glasses. Among them, $SnO$—$P_2O_5$—F-based glasses that can be easily decreased in deformation temperature are preferably used. Examples of specific compositions of the $SnO$—$P_2O_5$—F-based glasses include those containing, in terms of % by cation, 10 to 90% $Sn^{2+}$ and 10 to 70% $P^{5+}$ and, in terms of % by anion, 30 to 99.9% $O^2$ and 0.1 to 70% $F^-$. The reasons why the contents of the components are limited as just described will be described below. In the following description of the contents of the components, "%" means "% by cation" or "% by anion", unless otherwise specified.

$Sn^{2+}$ is a component for improving the chemical durability and the weather resistance. $Sn^{2+}$ also has the effect of decreasing the deformation temperature. The content of $Sn^{2+}$ is preferably 10 to 90%, more preferably 20 to 85%, and particularly preferably 25 to 82.5%. If the content of $Sn^{2+}$ is too small, the above effects are less likely to be achieved. On the other hand, if the content of $Sn^{2+}$ is too large, vitrification is less likely to be achieved and the resistance to devitrification is likely to decrease.

$P^{5+}$ is a component for forming the glass network. $P^{5+}$ also has the effect of increasing the light transmittance. In addition, $P^{5+}$ has the effect of suppressing devitrification and the effect of decreasing the deformation temperature. The content of $P^{5+}$ is preferably 10 to 70%, more preferably 15 to 60%, and particularly preferably 20 to 50%. If the content of $P^{5+}$ is too small, the above effects are less likely to be achieved. On the other hand, if the content of $P^{5+}$ is too large, the content of $Sn^{2+}$ becomes relatively small, so that the weather resistance is likely to decrease.

The content of $P^{5+}$ and $Sn^{2+}$ is preferably 50% or more, more preferably 70.5% or more, still more preferably 75% or more, yet still more preferably 80% or more, and particularly preferably 85% or more. If the content of $P^5$ and $Sn^{2+}$ is too small, the resistance to devitrification and the mechanical strength are likely to decrease. No particular limitation is placed on the upper limit of the content of $P^5$ and $Sn^{2+}$ and it may be 100%, but, if the glass matrix contains another or other components, the upper limit may be 99.9% or less, 99% or less, 95% or less, or 90% or less.

The glass matrix may contain, as cation components, the following components other than the above components.

$B^{3+}$, $Zn^{2+}$, $Si^{4+}$, and $Al^{3+}$ are components for forming the glass network and, particularly, have a significant effect of improving the chemical durability. The content of $B^{3+}+Zn^{2+}+Si^{4+}+Al^{3+}$ is preferably 0 to 50%, more preferably 0 to 30%, still more preferably 0.1 to 25%, yet still more preferably 0.5 to 20%, and particularly preferably 0.75 to 15%. If the content of $B^{3+}+Zn^{2+}+Si^{4+}+Al^{3+}$ is too large, the resistance to devitrification is likely to decrease. In addition, Sn metal or the like precipitates with increasing melting temperature, so that the light transmittance is likely to decrease. In further addition, the deformation temperature is likely to increase. From the viewpoint of improving the weather resistance, the glass matrix preferably contains 0.1% or more $B^{3+}+Zn^{2+}+Si^{4+}+Al^{3+}$. Note that "(component)+(component)+ . . . " herein means the sum of the contents of the relevant components.

The respective preferred content ranges of components $B^{3+}$, $Zn^{4+}$, $Si^{4+}$, and $Al^{3+}$ are as follows.

$B^{3+}$ is a component for forming the glass network. In addition, $B^{3+}$ has the effect of improving the weather resistance and, particularly, has a significant effect of suppressing selective elution of $P^{5+}$ or other components of the glass into water. The content of $B^{3+}$ is preferably 0 to 50%, more preferably 0.1 to 45%, and particularly preferably 0.5 to 40%. If the content of $B^{3+}$ is too large, the resistance to devitrification and the light transmittance tend to decrease.

$Zn^{2+}$ is a component acting as a flux. In addition, $Zn^{2+}$ has the effect of improving the weather resistance, the effect of suppressing elution of glass components into various types of cleaning solution, such as abrasive cleaning water, and the effect of suppressing the alteration of the glass surface in conditions of heat and humidity. In further addition, $Zn^{2+}$ also has the effect of stabilizing vitrification. In view of these aspects, the content of $Zn^{2+}$ is preferably 0 to 40%, more preferably 0.1 to 30%, and particularly preferably 0.2 to 20%. If the content of $Zn^{2+}$ is too large, the resistance to devitrification and the light transmittance tend to decrease.

$Si^{4+}$ is a component for forming the glass network. In addition, $Si^{4+}$ has the effect of improving the weather resistance and, particularly, has a significant effect of suppressing selective elution of $P^{5+}$ or other components of the glass into water. The content of $Si^{4+}$ is preferably 0 to 20% and particularly preferably 0.1 to 15%. If the content of $Si^{4+}$ is too large, the deformation temperature is likely to be high. In addition, striae or seeds due to unmelt are likely to remain in the glass.

$Al^{3+}$ is a component capable of forming the glass network, like $Si^{4+}$ and $B^{3+}$. In addition, $Al^{3+}$ has the effect of improving the weather resistance and, particularly, has a significant effect of suppressing selective elution of $P^{5+}$ or other components of the glass into water. The content of $Al^{3+}$ is preferably 0 to 20% and particularly preferably 0.1 to 15%. If the content of $Al^{3+}$ is too large, the resistance to devitrification and the light transmittance tend to decrease. In addition, the melting temperature becomes high, so that striae or seeds due to unmelt are likely to remain in the glass.

$Mg^{2+}$, $Ca^{2+}$, $Sr^{2+}$, and $Ba^{2+}$ (alkaline earth metal ions) are components acting as a flux. In addition, these components have the effect of improving the weather resistance, the effect of suppressing elution of glass components into various types of cleaning solution, such as abrasive cleaning water, and the effect of suppressing the alteration of the glass surface in conditions of heat and humidity. In further addition, they are components for increasing the hardness of the glass. However, if the content of these components is too large, the resistance to devitrification is likely to decrease. Therefore, the content of $Mg^{2+}$, $Ca^{2+}$, $Sr^{2+}$, and $Ba^{2+}$ is preferably 0 to 10%, more preferably 0 to 7.5%, still more preferably 0.1 to 5%, and particularly preferably 0.2 to 1.5%.

$Li^+$ is a component having the largest effect of decreasing the deformation temperature among alkali metal oxides. In addition, $Li^+$ has high phase separability. Therefore, if the content of $Li^+$ is too large, the resistance to devitrification is likely to decrease. In further addition, $Li^+$ is likely to decrease the chemical durability and also likely to decrease the light transmittance. Therefore, the content of $Li^+$ is preferably 0 to 10%, more preferably 0 to 5%, still more preferably 0 to 1%, and particularly preferably 0 to 0.1%.

$Na^+$ has, like $Li^+$, the effect of decreasing the deformation temperature. However, if its content is too large, striae are likely to occur. In addition, the resistance to devitrification is likely to decrease. In further addition, $Na^+$ is likely to decrease the chemical durability and also likely to decrease the light transmittance. Therefore, the content of $Na^+$ is preferably 0 to 10%, more preferably 0 to 5%, still more preferably 0 to 1%, and particularly preferably 0 to 0.1%.

$K^+$ has, like $Li^+$, the effect of decreasing the deformation temperature. However, if its content is too large, the weather resistance tends to decrease. In addition, the resistance to devitrification is likely to decrease. In further addition, $K^+$ is likely to decrease the chemical durability and also likely to decrease the light transmittance. Therefore, the content of K2O is preferably 0 to 10%, more preferably 0 to 5%, still more preferably 0 to 1%, and particularly preferably 0 to 0.1%.

The content of $Li^+$, $Na^+$, and $K^+$ is preferably 0 to 10%, more preferably 0 to 5%, still more preferably 0 to 1%, and particularly preferably 0 to 0.1%. If the content of $Li^+$, $Na^+$, and $K^+$ is too large, devitrification is likely to occur and the chemical durability tends to decrease.

Aside from the above components, the glass matrix may contain $La^{3+}$, $Gd^{3+}$, $Ta^{5+}$, $W^{6+}$, $Nb^{5+}$, $Ti^{4+}$, $Y^{3+}$, $Yb^{3+}$, $Ge^{4+}$, $Te^{4+}$, $Bi^{3+}$, $Zr^{4+}$, and so on up to 10% in total.

Rare earth components, such as $Ce^{4+}$, $Pr^{3+}$, $Nd^{3+}$, $Eu^{3+}$, $Tb^{3+}$, and $Er^{3+}$, and $Fe^{3+}$, $Ni^{2+}$, and $Co^{2+}$ are components for decreasing the light transmittance. Therefore, the content of each of these components is preferably 0.1% or less and the glass matrix is more preferably free of these components.

$In^{3+}$ is highly likely to cause devitrification and, therefore, the glass matrix is preferably free of $In^{3+}$.

Furthermore, for environmental reasons, the glass matrix is preferably free of $Pb^{2+}$ and $As^{3+}$.

An anion component, $F^-$, has the effect of decreasing the deformation temperature and the effect of increasing the light transmittance. However, if its content is too large, the volatility during melting becomes high, so that striae are likely to occur. In addition, the resistance to devitrification is likely to decrease. The content of $F^-$ is preferably 0.1 to 70%, more preferably 1 to 67.5%, still more preferably 5 to 65%, yet still more preferably 2 to 60%, and particularly preferably 10 to 60%. Examples of a material for introducing $F^-$ include, other than $SnF_2$, fluorides of La, Gd, Ta, W, Nb, Y, Yb, Ge, Mg, Ca, Sr, Ba, and so on.

The glass matrix generally contains $O^{2-}$ as an anion component other than $F^-$. In other words, the content of $O^{2-}$ depends on the content of $F^-$. Specifically, the content of $O^{2-}$ is preferably 30 to 99.9%, more preferably 32.5 to 99%, still more preferably 35 to 95%, yet still more preferably 40 to 98%, and particularly preferably 40 to 90%.

Examples of the $SnO-P_2O_5$-based glasses include those containing, in terms of % by mole, 50 to 80% SnO, 15 to 25% $P_2O_5$ (exclusive of 25%), 0 to 3% $ZrO_2$, 0 to 10% $Al_2O_3$, 0 to 10% $B_2O_3$, 0 to 10% $Li_2O$, 0 to 10% $Na_2O$, 0 to 10% $K_2O$, 0 to 10% $Li_2O+Na_2O+K_2O$, 0 to 10% MgO, 0 to 3% CaO, 0 to 2.5% SrO, 0 to 2% BaO, 0 to 11% MgO+CaO+SrO+BaO, and 0 to 10% $ZrO_2+Al_2O_3+MgO$ and having a ratio of $SnO/P_2O_5$ of 1.6 to 4.8.

The average particle diameter of the glass powder 3a forming the glass matrix 3 is preferably 0.1 to 100 μm, more preferably 1 to 80 μm, still more preferably 5 to 60 μm, yet still more preferably 10 to 50 μm, and particularly preferably 15 to 40 μm. If the average particle diameter of the glass powder is too small, minute gaps G are less likely to be formed between the inorganic particles 1 and the glass powder 3a. As a result, the nanophosphor 2 is likely to make contact with the glass powder 3a, so that the nanophosphor 2 is likely to degrade. In addition, bubbles may be formed during sintering, so that the mechanical strength of the wavelength conversion member 20 may decrease. In further addition, the degree of light scattering inside the wavelength conversion member 20 becomes large, so that the luminous efficiency may decrease. On the other hand, if the average particle diameter of the glass powder 3a is too large, the nanophosphor-attached inorganic particles 10 are less likely to be homogeneously dispersed in the glass matrix 3, so that the luminous efficiency of the wavelength conversion member 20 may decrease.

The shape of the wavelength conversion member 20 is normally a platy shape, such as a rectangular plate shape or a disk shape. In this case, the thickness of the wavelength conversion member 20 is preferably 0.03 to 1 mm, more preferably 0.05 to 0.5 mm, and particularly preferably 0.1 to 0.3 mm. If the thickness of the wavelength conversion member 20 is too small, its mechanical strength tends to be poor. On the other hand, if the thickness of the wavelength conversion member 20 is too large, the sintering time becomes long, so that the nanophosphor 2 is likely to degrade. Alternatively, sintering tends to become insufficient.

The wavelength conversion member 20 can be used as a light emitting device in combination with an excitation light source, such as an LED or an LD.

The nanophosphor-attached inorganic particles 10 and the wavelength conversion member 20 can be produced, for example, in the following manners.

The nanophosphor-attached inorganic particles 10 can be produced by mixing a liquid comprising a nanophosphor 2 dispersed in a dispersion medium with inorganic particles 1 and then removing the dispersion medium in the liquid, for example, by heating treatment or vacuum drying. Examples of the dispersion medium include organic dispersion media, such as toluene and hexane.

From the viewpoint of suppressing the degradation of the nanophosphor 2 during drying, vacuum drying is preferred.

When, in the case where the inorganic particles 1 are porous, the mixture of a liquid comprising a nanophosphor 2 dispersed in a dispersion medium with the inorganic particles 1 is vacuum-dried, the nanophosphor 2 tends to be drawn into the pores of the inorganic particles 1. Thus, nanophosphor-attached inorganic particles 10 can be easily obtained in which the nanophosphor 2 is attached to the inside of the pores of the inorganic particles 1.

Nanophosphor-attached inorganic particles 10 may be produced by drying a sprayed mixture of a liquid comprising a nanophosphor 2 dispersed in a dispersion medium with inorganic particles 1. By doing so, granular nanophosphor-attached inorganic particles 10 can be obtained. Granular nanophosphor-attached inorganic particles 10 make the nanophosphor 2 more likely to be present between the constituent inorganic particles 1, so that the contact of the nanophosphor 2 with the glass matrix 3 can be further reduced.

Next, a glass powder 3a which will form a glass matrix 3 is mixed with the nanophosphor-attached inorganic particles 10 and the mixture is then fired, so that a wavelength conversion member 20 can be obtained. The firing temperature is preferably within ±50° C. from the deformation temperature of the glass powder 3a. Specifically, the firing temperature is preferably 380° C. or below, more preferably 300° C. or below, still more preferably 200° C. or below, and particularly preferably 180° C. or below. If the firing temperature is too high, the nanophosphor 2 is likely to degrade. In addition, the glass powder 3a excessively softens and fluidizes, so that gaps are less likely to be formed between the inorganic particles 1 and the glass matrix 3. On the other hand, if the firing temperature is too low, the sintering of the glass powder 3a becomes insufficient, so that the porosity of the wavelength conversion member 20 tends to be high. As a result, light scattering in the wavelength conversion member 20 becomes significant, so that the fluorescence (or excitation light) extraction efficiency is likely to decrease. Therefore, the firing temperature is preferably not less than 130° C.

When the mixture of the nanophosphor-attached inorganic particles 10 and the glass powder 3a is hot-pressed, softening and fluidization of the glass powder 3a are promoted, so that the mixture can be sintered in an extremely short time. Thus, the thermal energy applied to the nanophosphor 2 during firing can be largely reduced, so that the thermal degradation of the nanophosphor 2 can be significantly suppressed. In addition, a thin wavelength conversion member 20 can be easily produced.

EXAMPLES

The present invention will be described below in further detail with reference to specific examples. However, the present invention is not at all limited to the following examples and modifications and variations may be appropriately made without changing the gist of the invention.

Table 1 shows Examples 1 to 7 and Comparative Examples 1 and 2.

TABLE 1

|  |  | Ex. | | | | | | | Comp. Ex. | |
| --- | --- | --- | --- | --- | --- | --- | --- | --- | --- | --- |
|  |  | 1 | 2 | 3 | 4 | 5 | 6 | 7 | 1 | 2 |
| Inorganic Particles | Type | $Al_2O_3$ | $Al_2O_3$ | $Al_2O_3$ | $Al_2O_3$ | $Al_2O_3$ | ZnO | MgO | $Al_2O_3$ | — |
|  | Average Particle Diameter (μm) | 2.7 | 13.5 | 50.8 | 4.6 | 9.7 | 12.3 | 22.7 | 0.6 | — |
|  | Shape | crushed | crushed | crushed | spherical | spherical | crushed | crushed | spherical | — |
| Luminous Flux (lm) | | 12 | 24 | 56 | 19 | 25 | 26 | 16 | 2 | 1 |

Examples 1 to 7 and Comparative Example 1

Inorganic particles described in Table 1 were added into 100 μl of dispersion liquid comprising a nanophosphor (CdSe/ZnS, average particle diameter: 3 nm) dispersed at a concentration of 1% by mass in toluene as a dispersion medium, the particles and the liquid were mixed, and the dispersion medium was volatilized, thus obtaining nanophosphor-attached inorganic particles. The content of nanophosphor in the obtained nanophosphor-attached inorganic particles was 1% by mass.

An amount of 0.02 g of the nanophosphor-attached inorganic particles were mixed with 0.18 g of $SnO$—$P_2O_5$—F-based glass powder (average particle diameter: 25 μm, deformation temperature: 160° C.), thus obtaining a mixture. The obtained mixture was hot-pressed at 180° C. in an atmosphere of nitrogen. Thus, a platy wavelength conversion member was obtained. The content of the inorganic particles in the obtained wavelength conversion member was 10% by mass and the content of the nanophosphor therein was 0.1% by mass.

Comparative Example 2

The same glass powder as used in Example 1 was mixed with the dispersion liquid of nanophosphor prepared in Example 1 and the dispersion liquid was then volatilized, thus obtaining a mixture of the nanophosphor and the glass powder. The obtained mixture was hot-pressed under the same conditions as in Example 1, thus obtaining a platy wavelength conversion member. The content of the nanophosphor in the wavelength conversion member was adjusted to be equal to that in Example 1.

(Measurement of Luminescent Quantum Efficiency)

The obtained wavelength conversion members were measured in terms of luminous flux. The results are shown in Table 1. The luminous flux was measured in the following manner. Each wavelength conversion member was irradiated, in a calibrated integrating sphere, with light from a blue LED inverted by an electric current of 100 mA and the resultant light was retrieved through an optical fiber into a small spectrometer (USB-4000 manufactured by Ocean Optics, Inc.) to obtain luminescence spectra (an energy distribution curve) on a control PC. The luminous flux was calculated from the obtained luminescence spectra.

As shown in Table 1, the wavelength conversion members in Examples 1 to 7 exhibited luminous fluxes of 12 to 56 (lm), whereas the wavelength conversion members in Comparative Examples 1 and 2 exhibited luminous fluxes of 2 (lm) or less, which were inferior to those in Examples 1 to 7.

REFERENCE SIGNS LIST 1 inorganic particle
2 nanophosphor
3 glass matrix
3a glass powder
4 coating layer
10 nanophosphor-attached inorganic particle
20 wavelength conversion member

The invention claimed is:

1. A wavelength conversion member comprising:
nanophosphor-attached inorganic particles dispersed in a glass matrix; wherein
the nanophosphor-attached inorganic particles include:
inorganic particles having an average particle diameter of 1 μm or more, the inorganic particles being ceramic particles of oxides; and
a nanophosphor attached to outermost surfaces of the inorganic particles;
gaps are provided between the inorganic particles and the glass matrix, and the nanophosphor is located in the gaps; and
the inorganic particles are non-porous.

2. The wavelength conversion member according to claim 1, wherein the inorganic particles are made of at least one material selected from the group consisting of $SiO_2$, $Al_2O_3$, $ZrO_2$, $TiO_2$, MgO, ZnO, and CeO.

3. The wavelength conversion member according to claim 1, wherein the inorganic particles have a spherical shape, a crushed shape, an acicular shape, a flaky shape or a hollow bead-like shape.

4. The wavelength conversion member according to claim 1, wherein the inorganic particles are secondary particles.

5. The wavelength conversion member according to claim 1, wherein the nanophosphor has an average particle diameter of 1 to 100 nm.

6. The wavelength conversion member according to claim 1, wherein the nanophosphor is a quantum dot phosphor made of at least one material selected from the group consisting of CdS, CdSe, CdTe, ZnS, ZnSe, ZnTe, InP, GaN, GaAs, GaP, AlN, AlP, AlSb, InN, InAs, and InSb or a composite of two or more materials selected from the group.

7. The wavelength conversion member according to claim 1, further comprising coating layers on surfaces of the nanophosphor-attached inorganic particles.

8. The wavelength conversion member according to claim 1, wherein the glass matrix has a deformation temperature of 380° C. or below.

9. The wavelength conversion member according to claim 1, being formed of a sintered body of the nanophosphor-attached inorganic particles and a glass powder.

10. The wavelength conversion member according to claim 1, wherein the glass matrix is made of a $SnO$—$P_2O_5$-based glass or a $SnO$—$P_2O_5$-F-based glass.

11. A method for producing the wavelength conversion member according to claim 1, the method comprising the steps of:
mixing a liquid comprising a nanophosphor dispersed in a dispersion medium with inorganic particles;

producing nanophosphor-attached inorganic particles by removing the dispersion medium in the liquid; and mixing the nanophosphor-attached inorganic particles with a glass powder and then firing the nanophosphor-attached inorganic particles and the glass powder mixed together.

12. The method for producing a wavelength conversion member according to claim 11, wherein the glass powder has an average particle diameter of 0.1 to 100 μm.

13. The wavelength conversion member according to claim 1, wherein the average particle diameter of the inorganic particles is 5 μm or more and 200 μm or less.

14. The wavelength conversion member according to claim 1, wherein a content of the inorganic particles in the wavelength conversion member is, in terms of % by mass, 5% to 20%.

* * * * *